(12) United States Patent
Jacobsson et al.

(10) Patent No.: US 7,688,153 B2
(45) Date of Patent: Mar. 30, 2010

(54) AUTOMATICALLY TUNED TAIL FILTER

(75) Inventors: Harald Jacobsson, Västra Frölunda (SE); Lars Aspemyr, Kungsbacka (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 49 days.

(21) Appl. No.: 12/088,972

(22) PCT Filed: Oct. 5, 2005

(86) PCT No.: PCT/SE2005/001462

§ 371 (c)(1), (2), (4) Date: Apr. 2, 2008

(87) PCT Pub. No.: WO2007/040429

PCT Pub. Date: Apr. 12, 2007

(65) Prior Publication Data

US 2008/0266005 A1    Oct. 30, 2008

(51) Int. Cl.
H03B 5/12 (2006.01)
H03L 5/00 (2006.01)

(52) U.S. Cl. ............... 331/117 FE; 331/109; 331/183; 331/175

(58) Field of Classification Search .......... 331/117 R, 331/117 FE, 167, 175, 182, 177 V, 177 R, 331/109, 183
See application file for complete search history.

(56) References Cited

U.S. PATENT DOCUMENTS 5,629,652 A   5/1997   Weiss
6,211,745 B1  4/2001   Mucke et al.
6,680,657 B2 * 1/2004  Wang et al. ............. 331/177 V
6,861,913 B1  3/2005   Herzel et al.

OTHER PUBLICATIONS

Hegazi, et al.; "A 17-mW Transmitter and Frequency Synthesizer for 900-MHz GSM Fully Integrated in 0.35-um CMOS"; May 2003; IEEE Journal of Solid-State Circuits, vol. 38, No. 5; pp. 782-792.*

Hegazi, et al.; "A Filtering Technique to Lower LC Oscillator Phase Noise"; Dec. 2001; IEEE Journal of Solid State Circuits, vol. 36, No. 12; pp. 1921-1930.*

* cited by examiner

Primary Examiner—Robert Pascal
Assistant Examiner—Ryan J Johnson
(74) Attorney, Agent, or Firm—Michael G. Cameron

(57) ABSTRACT

The present invention relates to an oscillating circuit arrangement having a resonating arrangement with a first resonance frequency ($\omega o$) comprising a voltage controlled oscillator arrangement. It further comprises a tunable filter arrangement connected to the source node of said voltage controlled oscillator (VCO) arrangement. Said filter arrangement particularly comprises an equivalent current source resonating at a second resonance frequency $c\theta f$, the second resonance frequency being a multiple n, n=1 or 2 of said first resonance frequency ($\alpha > o$), n being equal to the minimum number of switch transistors required for oscillation of said VCO arrangement. The filter arrangement particularly comprises an inductor connected in parallel with a capacitor, said capacitor being adapted to be tunable such that the phase noise of the resonating arrangement can be minimized through tuning of the filter arrangement.

7 Claims, 10 Drawing Sheets

AUTOMATICALLY TUNED TAIL FILTER

FIELD OF THE INVENTION

The present invention relates to an oscillating circuit arrangement with a resonating arrangement resonating at a first resonance frequency and comprising a voltage controlled oscillator arrangement. The invention also relates to a method for minimizing the phase noise of an oscillating circuit arrangement including a resonating arrangement resonating at a first resonance frequency and comprising a voltage controlled oscillator arrangement.

STATE OF THE ART

Many different oscillating circuit arrangements comprising one or more Voltage Controlled Oscillators, in the following denoted VCO, are known. It is mostly of high importance to keep the phase noise as low as possible. A commonly used VCO topology comprises a common source/common emitter cross-coupled differential pair which is attractive due to its comparatively low phase noise, robust operation and since it can be made very small. In the state of the art FIG. 1A a cross-coupled differential pair VCO in a standard configuration is schematically illustrated. A current source $I_{in}$ sets the current bias. The current source may be transistor based but it may also comprise just a resistor. The current source may be provided with various filters around it in order to suppress the noise. Such a configuration suffers mainly from three drawbacks. First, the current source generates noise which is converted to oscillator phase noise. Second, the current source requires a certain DC voltage drop across it in order to work properly. This in turn means that there will be less voltage left for the core part of the VCO having as a result that the phase noise will not be minimized. Third, the limited impedance of the current source at RF frequency loads the resonator which also has a result that the phase noise will be unnecessarily high. In addition thereto the limited impedance has a tendency to increase current consumption.

FIG. 1B shows an alternative known configuration substantially corresponding to that of FIG. 1A but with the difference that the current source has been removed, i.e. it is simply a grounded source node version of the VCO of FIG. 1A. Through the removal of the current source, the noise produced by a current source will of course be eliminated and it requires no extra voltage. The loading of the resonator will however be considerably increased as compared to the embodiment of FIG. 1A. Further such a configuration will not be capable of suppressing common mode signals and disturbances and it will therefore be quite sensitive to noise. Moreover the current consumption is increased.

FIG. 1C shows still another known configuration which is similar to that of FIG. 1A but in which the current source has been replaced by an inductor which together with parasitic capacitances in the source node is resonant at twice the operating frequency and which hence will act as a current source. The inductor $L_0$ is selected such that it will resonate with the total parasitic capacitances in the source node of the transistor at twice the VCO operating frequency, $2 \times \omega_{00}$. It will theoretically have infinite impedance at $2 \times \omega_{00}$, which means that the loading of the resonator is minimized, and it consumes no extra voltage and generates only a minimal amount of noise. It can also have a noise filtering effect and reduce the loading of the resonator tank. Similar structures are for example shown in "Tail current noise suppression in RF CMOS VCOs" by P. Andreani and H. Sjoland, IEEE Journal of Solid-State Circuits, Vol. 37, No. 3, March 2002 and "A filtering technique to lower LC oscillator phase noise", by Hegazi, E; Sjoland, H; Abidi, A. A.; IEEE Journal of Solid-State Circuits, Vol. 36, No. 12, December 2001. However, such configurations will still suffer from drawbacks, first of all in that the current bias is very sensitive to variations in gate/base bias and thus temperature and process variations, which is similar to the configuration of FIG. 1B. Further, it only gives an optimized performance in a very narrow frequency band and performs poorly over frequency tuning and it is also sensitive to process variations. Such problems may be severe, particularly at low offset frequencies.

The situation is similar also for single-ended configurations, such as for example Colpitts transistors, also shown in the document referred to above by Hegazi et al.

SUMMARY OF THE INVENTION

What is needed is therefore an oscillating circuit arrangement as initially referred to which has a low phase noise. Most particularly an oscillating circuit arrangement is needed in which the resonator is loaded as little as possible by applied current biasing. Particularly an oscillating circuit arrangement is needed which also has a good switching performance, i.e. a high switching speed. Further yet an arrangement is needed which is robust and which has a low current consumption. Particularly an arrangement is needed which has a good performance in a broad frequency band and which is not sensitive to process variations, has a stable current bias, i.e. not sensitive to variations in gate/base bias, etc. Particularly an arrangement is needed which is capable to have a high performance in a broad frequency band also at low offset frequencies, which furthermore can be made as a small size device. Still further an arrangement is needed which is cheap and easy to fabricate and which has an extremely low phase noise.

A method for minimizing the phase noise of an oscillating circuit arrangement as initially referred to is also needed through which one or more above mentioned objects can be achieved.

Therefore an oscillating circuit arrangement as initially referred to is provided which comprises a tunable filter arrangement connected to the voltage controlled oscillator (VCO) arrangement. Said filter arrangement resonates at a second resonance frequency $\omega_f$, where the second resonance frequency is a multiple n, n=1 or 2 of said first resonance frequency, n being equal to the minimum number of functional switch transistors forming the VCO of the oscillating circuit arrangement required for the VCO to oscillate at said first (operating) frequency. The filter arrangement is tunable such that the phase noise of the resonating arrangement is minimized. Said filter arrangement particularly comprises an equivalent current source which comprises an inductor connected in parallel with a capacitor, said capacitor being adapted to be tunable such that the phase noise of the resonating arrangement is minimized.

Particularly the tunable filter arrangement is connected to the source node or the emitter node respectively for a FET or a bipolar transistor respectively. Particularly the tunable capacitor is adapted to be tuned in order to maximize the voltage amplitude at the source/emitter node of the voltage controlled oscillator or at the common source/emitter node of a cross-coupled differential pair voltage controlled oscillator. Particularly the filter arrangement is adapted to maximize the impedance at said second resonance frequency $\omega_f$.

In a particular implementation the circuit arrangement comprises or is connected to a control means adapted to establish the optimum tuning voltage (or current) to be applied to the tunable filter, particularly to the tunable capacitor of the filter arrangement.

Particularly the control means comprises a control circuit adapted to maximize the amplitude of the second resonance frequency. In one embodiment the control means comprises an amplitude detector for sensing the second resonance frequency signal amplitude of the signal resonating at the second resonance frequency, and second amplitude variation detection control means for detecting whether the amplitude varies (decreases or increases). In one embodiment said amplitude variation detection and control means comprises a differentiator for taking the derivative of said second resonance frequency signal amplitude. Said second amplitude variation detection control means may comprise a switch control means for controlling a switch, whereby said switch control means may be adapted to control a switch which in a first position acts as a voltage (or current) regulating circuit comprising a voltage (or current) increasing circuit and in the other position acts as a voltage (or current) decreasing circuit. Particularly said voltage increasing circuit comprises a voltage pump up circuit for ramping the voltage up to a preset maximum voltage whereas said voltage decreasing circuit comprises a voltage pump down circuit for ramping the voltage down to a preset minimum voltage.

In an advantageous implementation the switch control means are adapted to select which of the voltage (or current) increasing circuit and the voltage (or current) decreasing circuit that is to be connected to the source/emitter node. In a particular implementation the control means comprises tuning voltage control means for controlling the tuning voltage adapted to tune the source/emitter node varactor. Particularly the second amplitude variation detection control means comprises a differentiator for taking the derivative of the amplitude of the output AC signal. Particularly the switch activator is adapted to activate the switch if the input signal, i.e. the derivative, is negative whereas in an activated state, the switch is adapted to activate the voltage increasing/decreasing means, or vice versa.

In particular embodiments of the present invention the oscillating circuit arrangement comprises a cross-coupled differential pair VCO and the source node is common to the, here, two switch transistors thereof. Then the second resonance frequency, i.e. the resonating frequency of the filter arrangement, or more particularly of the equivalent current source, is $2 \times \omega_0$, hence n being =2. In such embodiments the filter arrangement is arranged at the common source node. In a particular implementation the filter arrangement is arranged at the source node of n-MOS transistors for a differential structure comprising pairs of n-MOS-p-MOS transistors.

Most particularly the VCO comprises an n-MOS complementary VCO and the tunable filter arrangement may be provided at the source node of the n-MOS transistors, at the source node of the p-MOS transistors or tunable filter arrangements may be provided at the source node of both the p-MOS transistor and the n-MOS transistor simultaneously, which however does not further increase performance.

In alternative implementations of the present invention the oscillating circuit arrangement comprises a single-ended VCO, for example comprising a Colpitts oscillator. In that case the second resonance frequency of the filter arrangement, e.g. the resonance frequency of the equivalent current source is $\omega_0$, n hence being =1. The oscillating circuit or the transistor arrangement may be implemented using CMOS technology, FET, HEMT, but it may also comprise bipolar transistors. The inventive concept is particularly advantageous for CMOS implementations.

It should be clear that many different VCO implementations are possible, for example also differential implementations of single-ended Colpitts VCOs, e.g. with two tunable filter arrangements which however should be parallel resonant at the oscillator frequency, i.e. at the first resonant frequency, $\omega_0$, and not at twice oscillating frequency, i.e. of $\omega_f = \omega_0$ and not $2\omega_0$, since the number of functional switch transistor actually is one (only one is required for oscillation) of the VCO at the operating frequency $\omega_0$.

However, for one or more differential pairs of transistors (cross-coupled, emitter-source interconnected) the second oscillating frequency (of the tunable filter arrangement) should always be $\omega_f = 2\omega_0$, i.e. n=2.

The logical concept functional switch transistors has been introduced to express that the second resonance frequency depends on the minimum number of switch transistors required for the VCO arrangement to oscillate at the first resonance frequency and it does not relate to the actual number of switch transistors of the VCO arrangement. The inventive concept can also be expressed such that for differential cross-coupled pairs, the second resonance frequency should be the second harmonic ($2\omega_0$), and for single-ended structures (differential or not), it is the operation frequency ($\omega_0$).

In order to solve the above mentioned problems a method as initially referred to is also provided which comprises the steps of; connecting a tunable filter arrangement to a voltage controlled oscillator arrangement; tuning the filter arrangement for example through applying a voltage such that the filter arrangement will resonate at a frequency substantially being an integer multiple n; n=1; 2 of said first resonance frequency and corresponding to the number of functional switch transistors necessary for the oscillation of the oscillating circuit arrangement at the first resonance frequency. Particularly the tunable filter arrangement is connected to the source node/emitter node of the VCO arrangement, for a FET or a bipolar implementation respectively. Particularly the method comprises the step of; providing the filter arrangement through connecting a tunable capacitor in parallel with an inductor adapted to resonate at said second resonance frequency. Particularly the tuning step comprises; tuning the filter arrangement, particularly the tunable capacitor thereof, such that the voltage amplitude at the source/emitter node of the voltage controlled oscillator (single-ended structure) or at the common source/emitter node of the voltage controlled oscillator of a differential pair structure comprising a cross-coupled differential pair VCO, is maximized. Additionally or alternatively the method comprises the step of; using, in a control procedure, a control means comprising a control circuit for automatically finding the optimum (varactor) tuning voltage. Particularly the control procedure includes the steps of; establishing the amplitude of the second resonance frequency, e.g. the n:th harmonic of the signal in the source node; establishing if the amplitude is decreasing and/or if it is increasing; controlling the tuning voltage (applied to the tunable capacitor) such that the amplitude is increased. This means that it is possible to both find out if the amplitude is increasing and if it is decreasing, or it is enough to establish whether it is decreasing, in which case the amplitude has to be increased, or only if it is increasing, in which case a negative response indicates that it is decreasing and that the tuning voltage should be controlled in such a manner that the amplitude will be increased. Particularly the step of establishing if the amplitude is varying or increasing/decreasing comprises; taking the derivative, using a differentiator, of the amplitude of the relevant n:th harmonic signal in the source/emitter node or in the common source/emitter node if it comprises a differential cross-coupled pair structure.

It should be clear that the inventive concept covers different types of filter arrangements as long as they are tunable and have a high impedance at said second resonance frequency. One example of a filter comprises an inductor in series with a varactor, which are connected in parallel with another inductor. Another example relates to a λ/4-transmission line filter. There may also be more than one tunable filter arrangement, e.g. for differential versions of single-ended Colpitts VCOs, but also for other structures.

BRIEF DESCRIPTION OF THE DRAWINGS

The invention will in the following be further described, in a non-limiting manner, and with reference to the accompanying drawings, in which.

DETAILED DESCRIPTION OF THE INVENTION

Figure 1A:
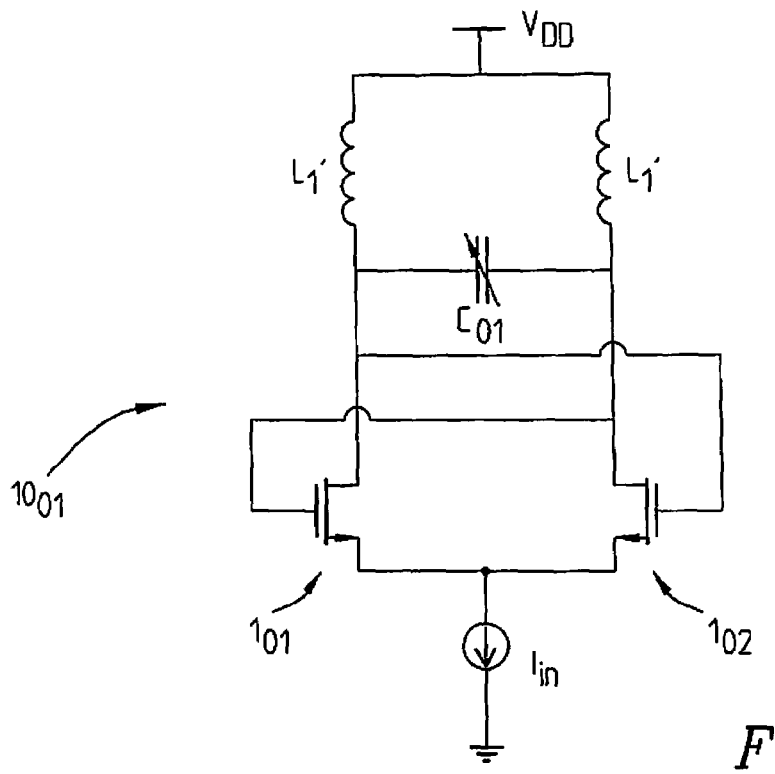
FIG. 1A shows a cross-coupled differential pair VCO in a standard configuration in which a current source sets the current bias.
Figure 1B:
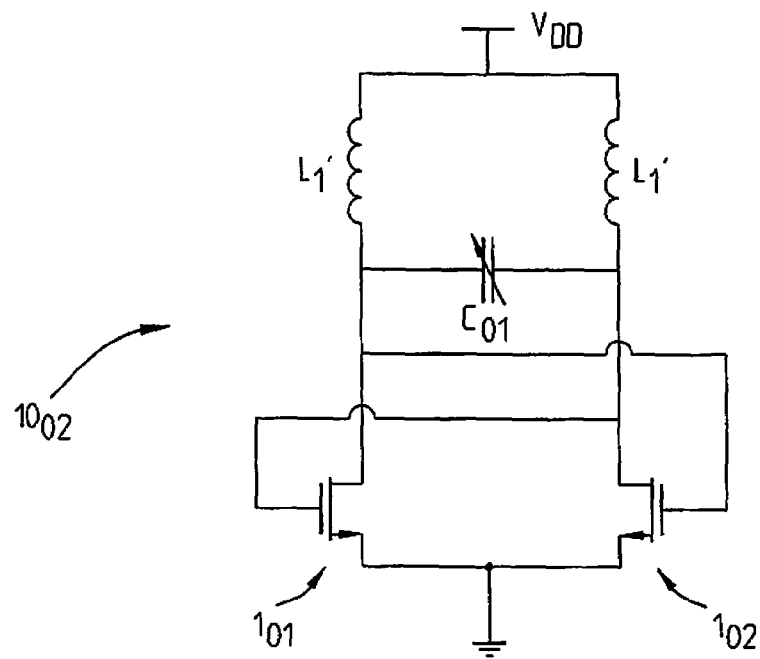
FIG. 1B shows a cross-coupled differential pair VCO as in FIG. 1A but where the current source has been removed.
Figure 1C:
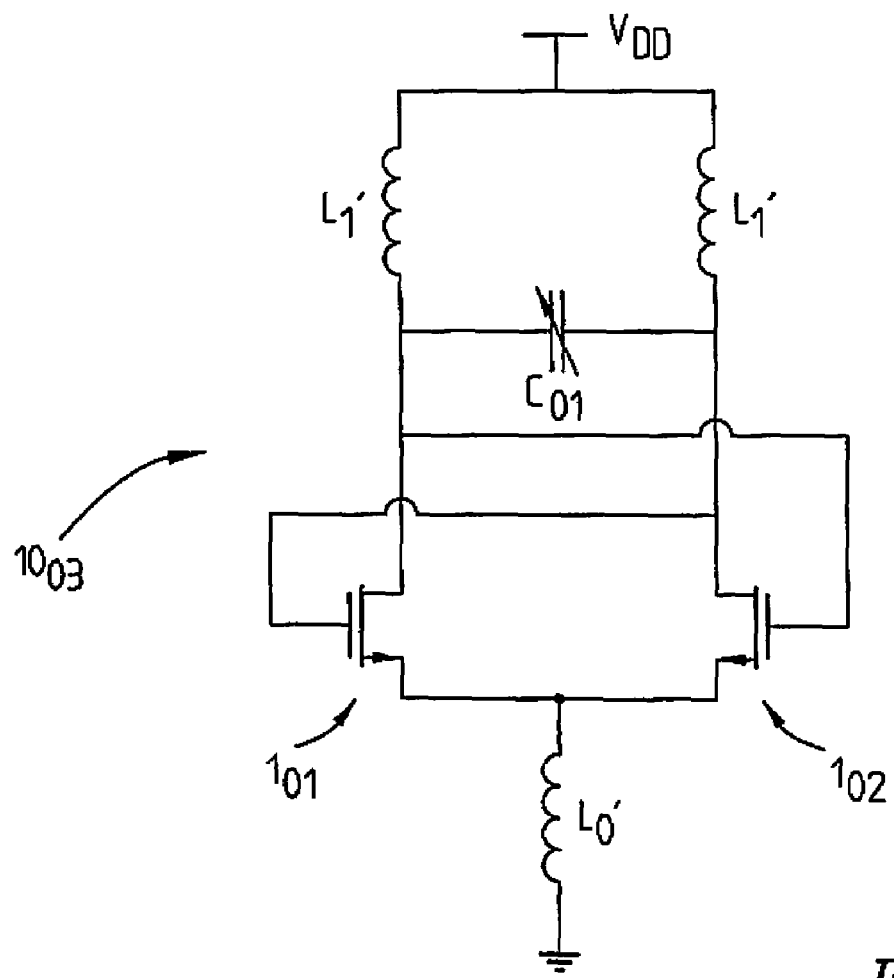
FIG. 1C shows an arrangement as in FIG. 1A where the current source has been replaced by an inductor according to the state of the art.

The state of the art FIGS. 1A-1C and the disadvantages associated therewith have been discussed earlier in the state of the art section since they constitute standard configurations of cross-coupled differential pair VCOs $10_{01}$, $10_{02}$, $10_{03}$ supplied with the voltage $V_{DD}$ and comprising a first and a second switch transistor $1_{01}$, $1_{02}$ and a varactor $C_{01}$. The varactor $C_{01}$ may, for example, be implemented as a MOS capacitor or as a p-n junction etc. Hence, as discussed in the state of the art section, the current source $I_{in}$ is used to set the current bias in the implementation of FIG. 1A whereas FIG. 1B merely shows a grounded variation and FIG. 1C shows an arrangement in which the current source has been replaced by an inductor $L_{01}$.

Figure 2:
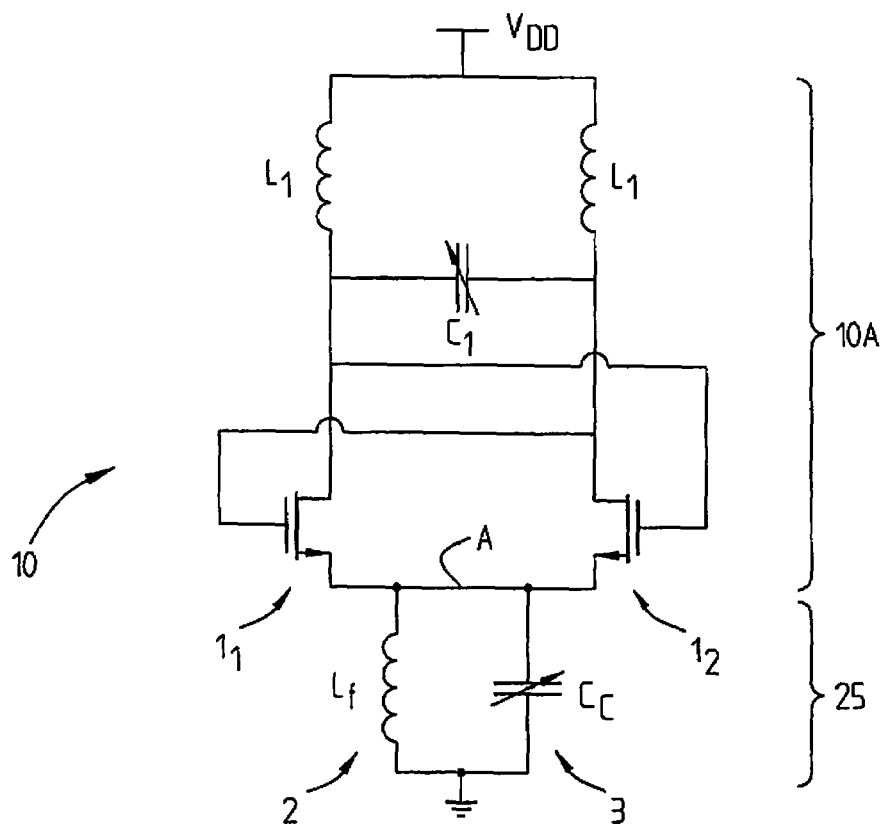
FIG. 2 shows a first implementation of an arrangement according to the inventive concept comprising a cross-coupled differential pair VCO.

FIG. 2 shows a first embodiment of the present invention. The oscillating circuit arrangement 10 here comprises a cross-coupled differential pair VCO structure, in a conventional manner. The first (functional) switch transistor $1_1$ and the second (functional) switch transistor $1_2$ are fed by the feeding voltage $V_{DD}$ and comprise a resonator tank with inductors $L_1$, $L_1$ and varactor $C_1$. However, according to the present invention a filter arrangement 25 with an inductor $L_f$ 2 connected in parallel with a tunable capacitor $C_c$ 3 is provided at the common source node of the functional switch transistors $1_1$, $1_2$. Through the provisioning of the tunable capacitor 3 in parallel with the inductor 2 it gets possible to minimize the phase noise of the cross-coupled differential pair VCO over frequency and process variations by tuning the varactor 3 to the appropriate voltage/capacitance. The cross-coupled differential VCO structure is here supposed to resonate with the resonance frequency $\omega_0$. For such a cross-coupled differential pair VCO structure it has been found that the filter arrangement, here comprising inductor 2 and tunable capacitor (varactor) 3, should resonate at the frequency $2 \times \omega_0$ and the impedance of the filter arrangement 25 can be optimized or maximized throughout the tuning range. According to the invention it can be shown that if the varactor 3 voltage is tuned very carefully, the phase noise can be reduced considerably, particularly at low offset voltages. For example, at 1 kHz offset, the reduction can actually exceed 10 dB. This is of particular importance for CMOS VCOs where the phase noise at low offset is relatively high due to the high 1/f noise in CMOS transistors. It should be clear that the filter arrangement in the source node can have different configurations and is not limited to the specific implementation shown in FIG. 2. The requirements on the filter arrangement are that it should have an impedance which is as high as possible at the second harmonic, i.e. at $2 \times \omega_0$ for a cross-coupled differential pair structure and it of course has to be tunable, e.g. comprise one or more tunable capacitors or varactors. In alternative embodiments the filter arrangement may comprise a tunable delay line, a tunable dielectric filter wherein the dielectric constant can be tuned etc. According to the invention it has been found that in order to minimize the phase noise, the impedance of the filter should be maximized. This is advantageously achieved if the varactor tuning voltage is selected in such a manner that the voltage amplitude A at the source (emitter) node is maximized. This can be done in many different manners. In some implementations the filter arrangement has such a configuration that it additionally has an impedance which is as low as possible at DC. This is however not always advantageous since noise from ground may reach or influence the oscillator. However, a low impedance means that no, or a low, voltage drop only is required, which is advantageous.

Alternative filter configurations may for example comprise a SAW (Surface Acoustic Wave) filter provided with tunable means, e.g. a varactor or filter arrangements as described below with reference to FIGS. 11,12.

For bipolar implementations the filter arrangement should be provided at the emitter node.

Figure 3:
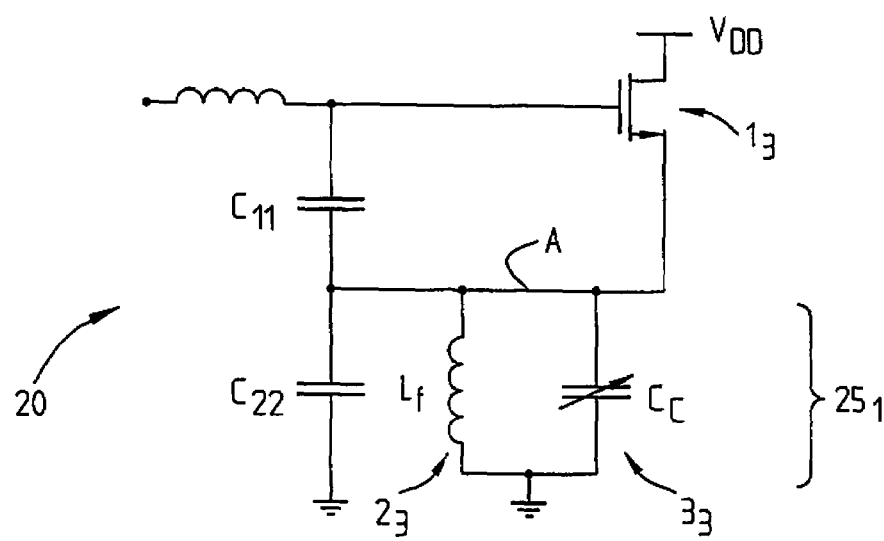
FIG. 3 shows a second implementation of the inventive concept wherein the oscillating circuit arrangement comprises a Colpitts transistor.

FIG. 3 shows an alternative embodiment comprising a single-ended VCO structure 20 comprising a transistor $1_3$, a resonator tank comprising inductor $L_{11}$, capacitors $C_{11}$, $C_{22}$ which, at the source node, is provided with a filter arrangement as in FIG. 2 comprising an inductor $L_f 2_3$ and a tunable capacitor or varactor $C_c 3_3$ connected in parallel. The single ended structure here comprises a Colpitts oscillator. The filter arrangement comprising the filter inductor $2_3$ and the tunable capacitor $3_3$ in this case has a resonant frequency also at $\omega_0$, i.e. it resonates at the operating frequency of the Colpitts oscillator and not at the second harmonic as for the cross-coupled differential pair structure as shown for example in FIG. 2. According to different embodiments a bias current source may be connected to the filter arrangement whereas in other embodiments there is no bias current source connected to the filter arrangement shown in FIG. 3. In other aspects the functioning is similar to that described with reference to FIG. 2 and also as will be described with reference to the FIGS. 4-10 with the difference that the resonant frequency also for the filter arrangement is $\omega_0$. I.e., for a single ended structure n=1 (n being the factor to be multiplied with the resonance frequency of the VCO structure) also for differential structures, different from for a differential pair structure comprising two functional switch transistors, resonating at a frequency $\omega_0$, where the filter arrangement should resonate at $2\times\omega_0$, i.e. n=2 corresponding to the number of functional switch transistors. For differential structures with one functional switch transistor, cf. FIGS. 4A, 4B n=1 (even if there are more than one switch transistor, there merely being a differential output signal and the switch transistors not being cross-coupled and having two feedback loops.

Figure 4A:
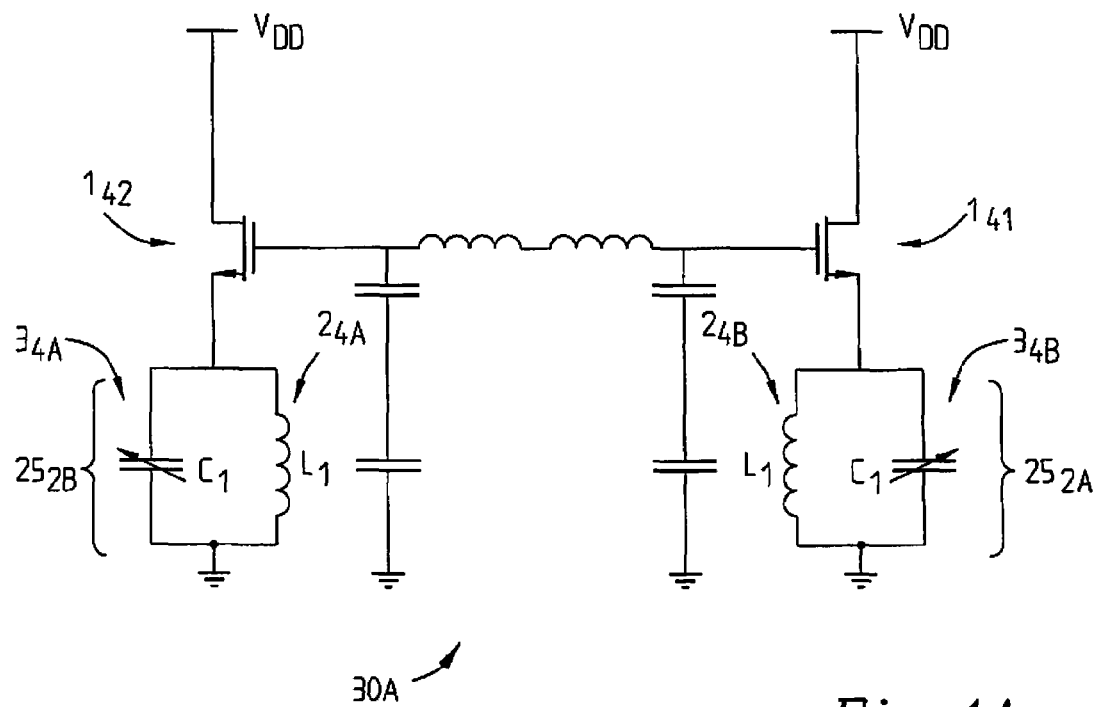
FIG. 4A shows an embodiment in which the oscillating circuit arrangement comprises a differential version of a single-ended Colpitts VCO.

FIG. 4A shows an oscillating circuit arrangement, 30A, comprising a differential implementation of a single-ended Colpitts VCO comprising two mirrored and interconnected single-ended Colpitts VCOs, cf. FIG. 3. Hence a tunable filter arrangement $25_{2A}$ similar to that of FIG. 3 is connected to the source of the transistor 141 and another tunable filter arrangement $25_{2B}$ is connected to the source of the other transistor $1_{42}$. The two source filter arrangements $25_{2A}, 25_{2B}$ are parallel resonant at the oscillating frequency $\omega_0$, i.e. $\omega_f = \omega_0$, and not at $2\omega_0$ as in the cross-connected differential pair structure of FIG. 2.

Figure 4B:
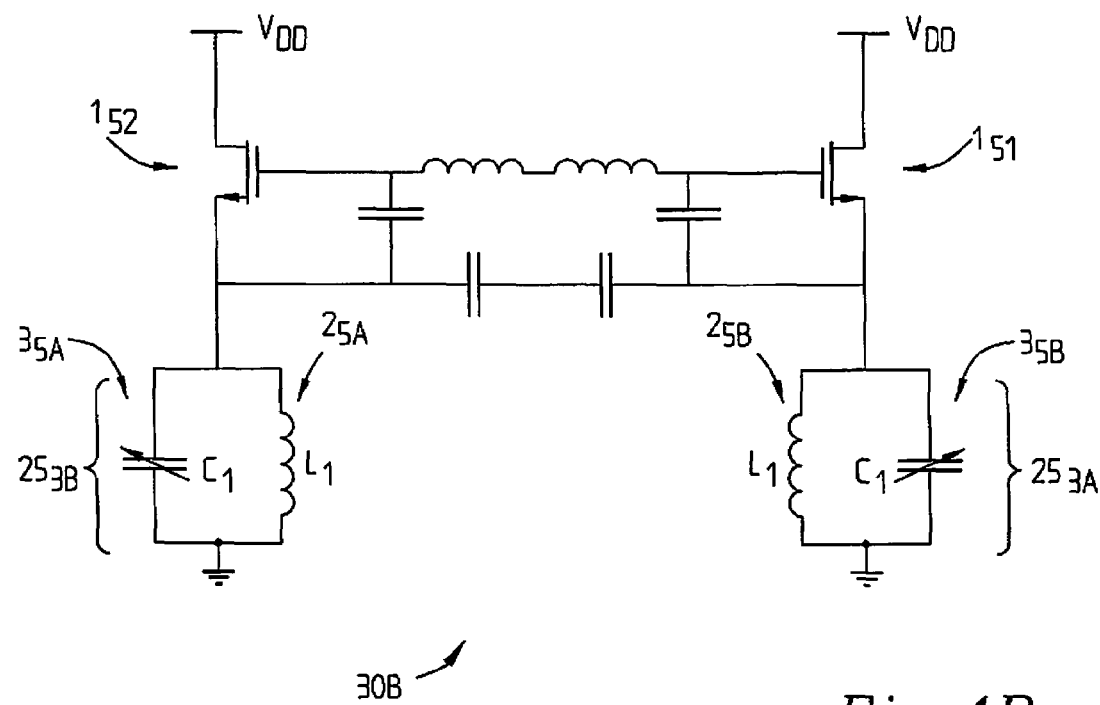
FIG. 4B shows an alternative implementation of an oscillating circuit arrangement comprising a differential version of a single-ended VCO.

FIG. 4B shows another way of implementing a differential single-ended Colpitts VCO, with two transistors $1_{51}, 1_{52}$ to the respective sources of which tunable filter arrangements $25_{3A}, 25_{3B}$ are connected. The principle of the functioning is the same as that of the arrangement shown in FIG. 4A.

Figure 5:
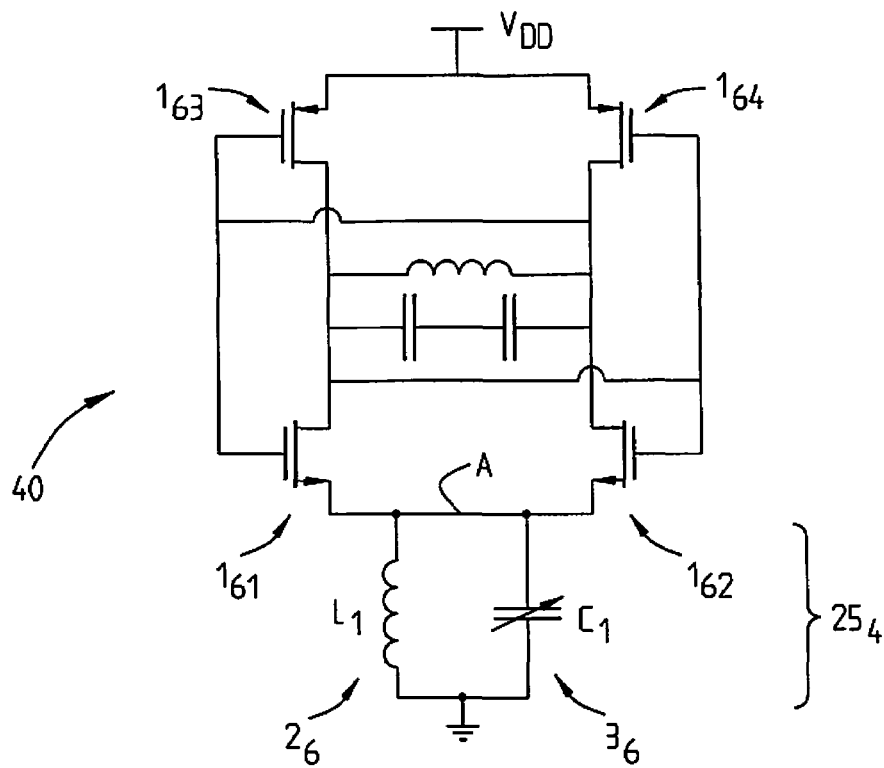
FIG. 5 shows an embodiment of the invention in which the oscillating circuit arrangement comprises an n-MOS-p-MOS complementary VCO.

FIG. 5 shows an oscillating circuit arrangement 40 comprising an n-MOS-n-MOS complementary VCO comprising two p-MOS transistors $1_{63}, 1_{64}$ and two n-MOS transistors $1_{61}, 1_{62}$. The tunable filter arrangement $25_4$ comprising a tunable capacitor $3_6$ connected in parallel with an inductor $2_6$ is connected to the common source of the n-MOS transistors $1_{61}, 1_{62}$. The functioning corresponds to that described with reference to FIG. 2.

Figure 6:
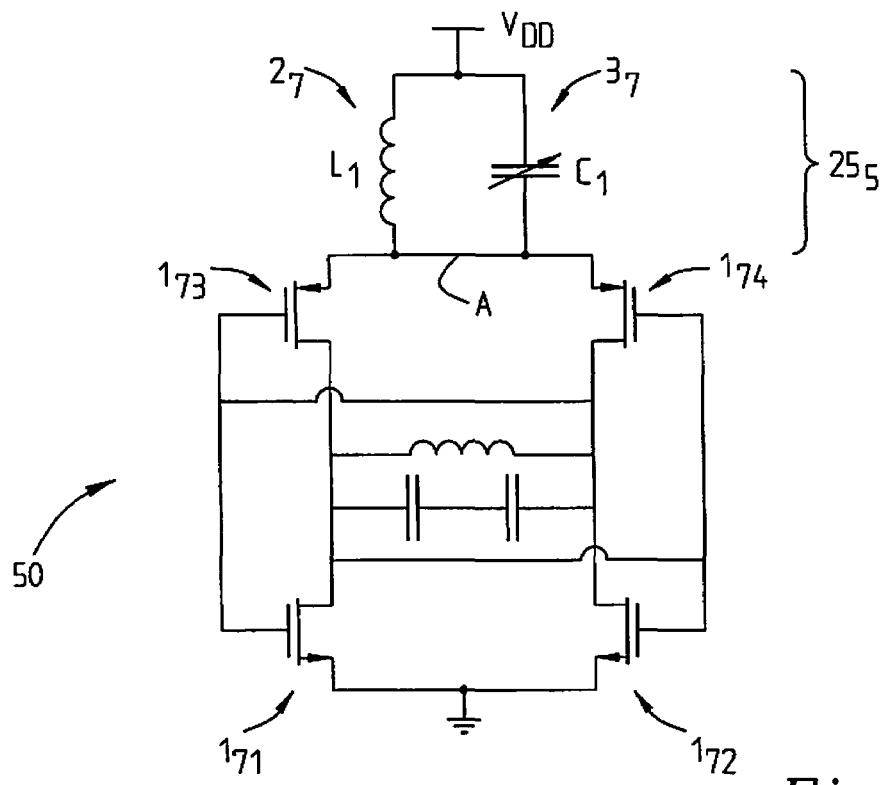
FIG. 6 shows an alternative embodiment of an oscillating circuit arrangement comprising an n-MOS-p-MOS complementary VCO.

FIG. 6 shows still another implementation of a n-MOS-p-MOS complementary VCO comprising a circuit arrangement 50 with n-MOS transistors $1_{71}, 1_{72}$ and p-MOS transistors $7_{73}, 1_{74}$ with a tunable filter arrangement $25_5$ comprising a tunable capacitor $3_7$ in parallel with an inductor $2_7$ and connected to the source of the p-MOS transistors $1_{73}, 1_{74}$. In other aspects the functioning corresponds to that of FIG. 5 and FIG. 2.

Figure 7:
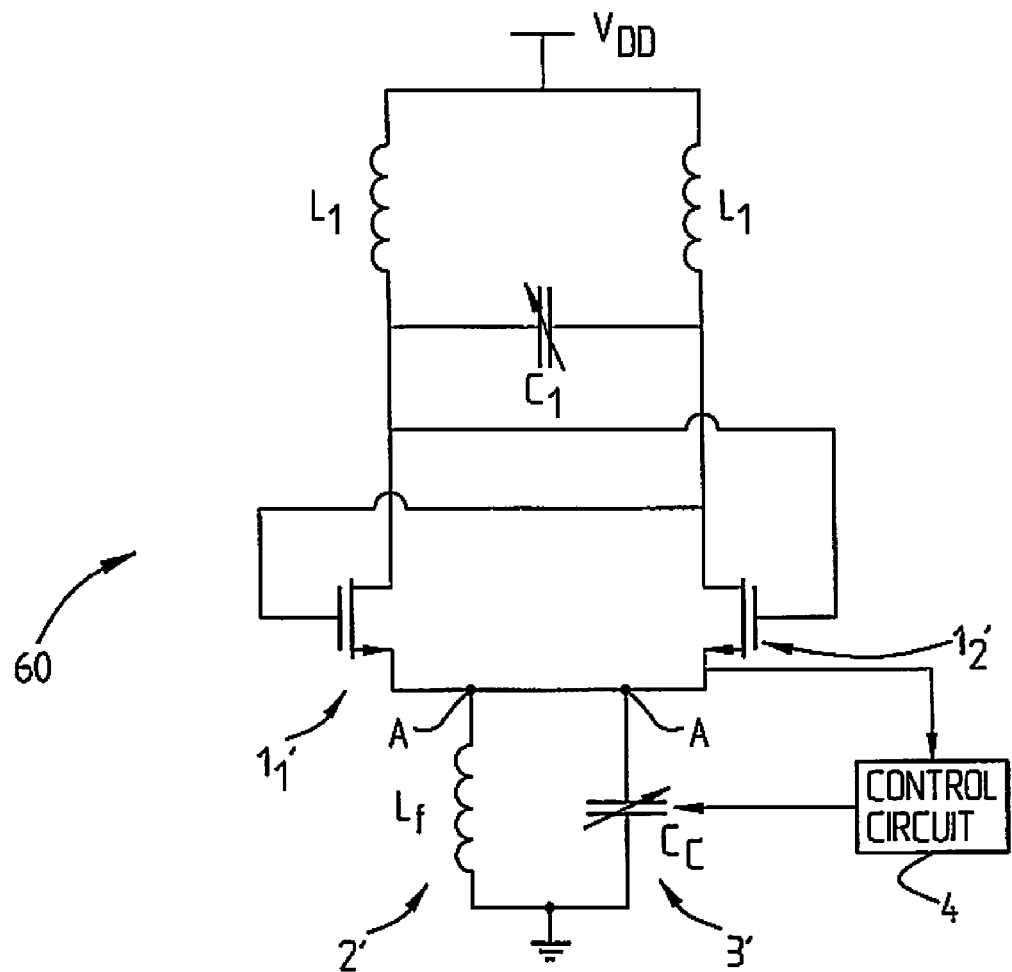
FIG. 7 shows an arrangement as in FIG. 2 further comprising a control circuit.

In order to facilitate the establishment of which the correct varactor tuning voltage should be, i.e. the tuning voltage to apply to the tunable capacitor of the filter arrangement, since in real applications often manual tuning can not be implemented for reasons of costs, i.e. it is not applicable for low cost applications, control means may be provided. FIG. 7 shows one example of an embodiment in which a control circuit 4 is provided which preferably is adapted to automatically find the optimum tuning voltage of the tunable capacitor $C_c$ 3' provided in parallel with the filter inductor $L_f$ 2', preferably independently of the operation frequency and of any process variations. Hence, the control circuit 4 should be able to optimize the varactor tuning voltage such that the phase noise can be minimized.

However, the phase noise is difficult to measure, and a consequence thereof is that it is difficult also for a control circuit to automatically minimize the phase noise. Therefore, as referred to above, according to the invention, it is suggested that the amplitude of the second harmonic (for a cross-coupled differential implementation with two functional switch transistors) in the source (emitter) node of the transistors $1_1', 1_2'$ is maximized. For that the control circuit 4 may be used, cf. FIG. 7. It has been realized that the phase noise has a minimum coinciding with the maximum in the second harmonic amplitude (for a differential structure; for a single ended (differential or not) implementation at the oscillating frequency of the first resonance frequency), if everything else is fixed and only the filter arrangement is tuned. For the oscillating circuit arrangement 60 shown in FIG. 7, the second harmonic amplitude will have a maximum when the source filter of the filter arrangement is resonant and that is where the resonator is loaded the least (by the biasing) and hence the lowest phase noise can be expected.

It should be clear that the control circuit can be implemented in many different ways.

Figure 8:
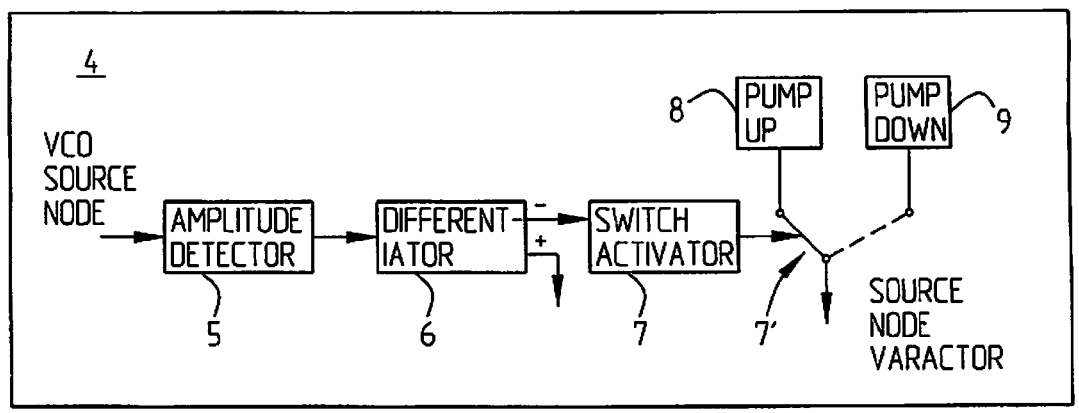
FIG. 8 is a schematical block diagram of an exemplary control circuit.

FIG. 8 is a block diagram showing one example of a control circuit 4. In this particular embodiment the control circuit 4 comprises an amplitude detector 5, a differentiator 6, a switch activator 7 and a voltage pump up circuit 8 and voltage pump down circuit 9 respectively, either of which circuits 8,9 can give an input to a source node (filter) varactor if the voltage amplitude has to be varied, i.e. increased/decreased. The circuit substantially, according to this embodiment, functions in such a way that the amplitude detector 5 detects the amplitude A, cf. FIGS. 2 and 4, of the, in this case, second harmonic signal in the source node of the differential pair structure VCO. In this case the differentiator 6 then takes the derivative of the detected amplitude A. In a particular embodiment, if the derivative is positive, the amplitude is increasing and hence no action is required indicated through the arrow with a "+" in the figure. If, on the other hand, the derivative is negative, the amplitude is decreasing and hence the tuning voltage applied to the source node varactor, i.e. the tunable varactor 3' (FIG. 4) needs to be ramped in the opposite direction. This is enabled through an input signal (indicated with an arrow with a "−" in the figure) to switch activator 7 which then appropriately activates the switch, i.e. either a connection is established with the pump up circuit 8 or to the pump down circuit 9. If the input signal is not negative (−) the switch activator will do nothing as discussed above, i.e. if the differentiator output is positive.

The pump up circuit 8 is capable of ramping a voltage up to a preset maximum value, preferably, not necessarily, with a large time constant. The pump down circuit 9 ramps a voltage down to a preset minimum value in a similar manner. The switch 7' selects which of the pump up circuit 8 or the pump down circuit 9 that is to be connected to the output and hence to the tunable source node varactor 3'.

It should be clear that the amplitude A of a node can be detected in many different manners.

Figure 9:
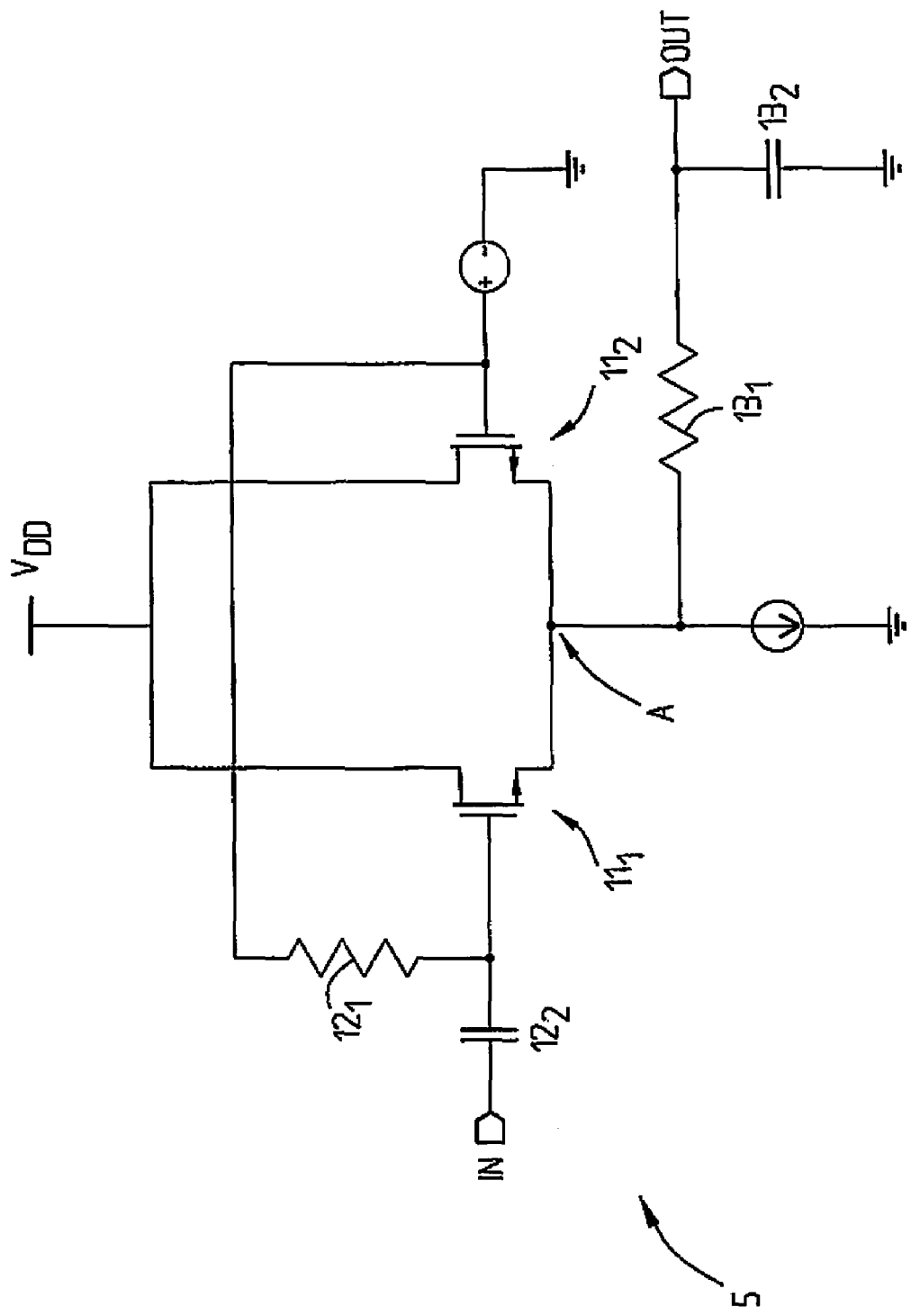
FIG. 9 is an example of an amplitude detector that can be used in the control circuit of FIG. 8.

FIG. 9 schematically illustrates one example of a circuit that can be used in or as the amplitude detector 5. However, there are many alternative ways to detect amplitude of an AC signal and the invention is of course not limited to this specific circuit or this specific manner of detecting the amplitude. The output is a DC or near DC signal that monotonically increases with the amplitude of the input AC signal on condition that the component values of the output RC low pass filter comprising a resistor 13, and a capacitor $13_2$ are chosen appropriately.

The DC component of the amplitude A at the source node of the two transistors $11_1$, $11_2$ is proportional to the input signal amplitude.

At input a biasing capacitor $12_2$ and a biasing resistor $12_1$ are shown. Such or similar amplitude detection circuits are e.g. shown in "A low-noise, low-power VCO with automatic amplitude control for wireless applications" by M. Margarit et al. in IEEE Journal of solid-state circuits, Vol. 34, No. 6, June 1999.

Figure 10:
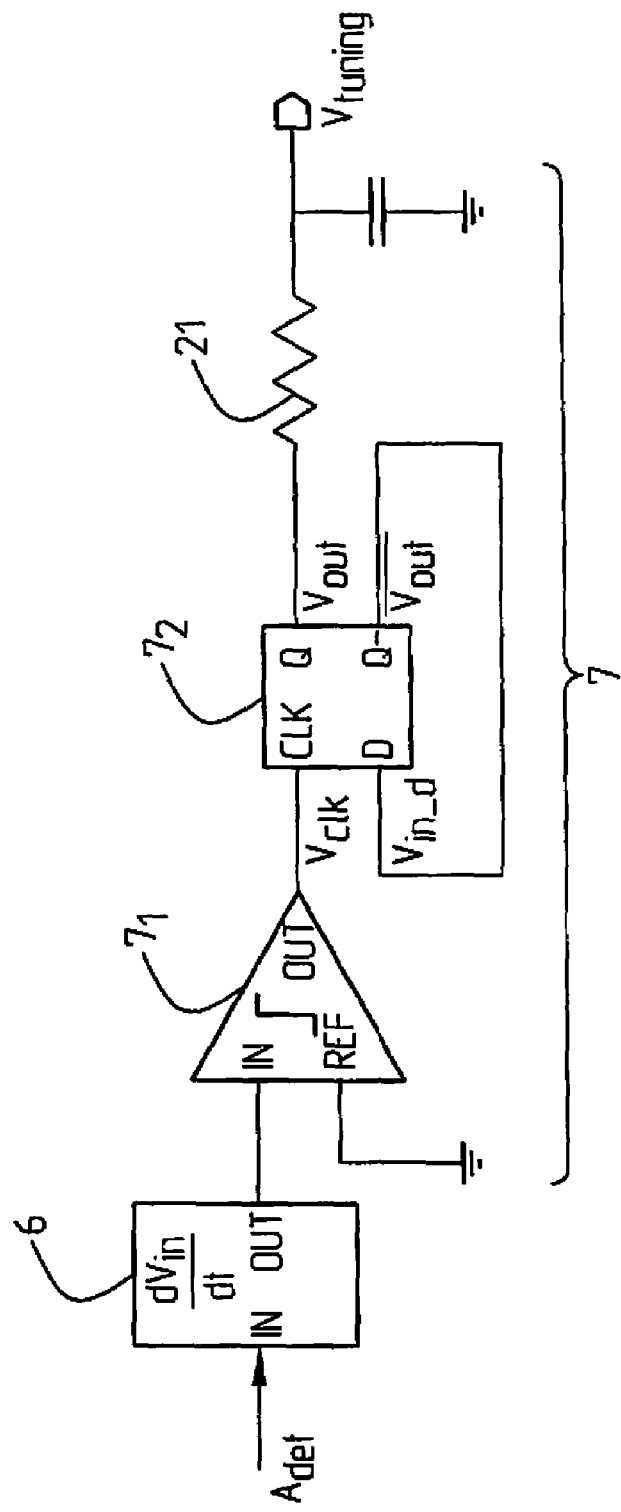
FIG. 10 is a block diagram of an exemplary circuit for optimizing the amplitude.

FIG. 10 schematically illustrates a block diagram of an exemplary circuit for optimizing the amplitude A comprising a differentiator 6, and means performing the functions of the switch activator 7, switch 7' and the pump up/pump down circuits 8,9 respectively. The output signal from the amplitude detection circuit, for example amplitude detection circuit 5 of FIG. 6, is applied to differentiator 6. The output from the differentiator 6 is applied to comparator $7_1$, the output of which goes high if the derivative of the amplitude A, (here denoted dVin/dt, Vin being the input from the amplitude detector) is positive and the output of which goes low if the derivative of the amplitude is negative. The output of the comparator $7_1$ is applied to the clock input of a D-flip-flop $7_2$. The D-input of the flip-flop is connected to the Q-output. Whenever the clock is activated, the Q output of the flip-flop is changed. The circuit of FIG. 7 works properly if the Q output of the flip-flop is changed only when the amplitude derivative dVin/dt (or dA/dt) is negative. Hence the flip-flop should be activated by the negative flank of the clock. If necessary an inverter (not shown) is provided before the flip-flop for this purpose. Another inverter may also be provided after the D flip-flop to ensure enough drive capability.

It should be clear that this merely constitutes one particular example of how such a circuit could work and there are several possible alternative configurations and modifications, adaptations and improvements can be made depending on the particular needs and requirements of the relevant applications.

The functioning is similar for a single-ended implementation, for example for a control circuit applied to a Colpitts transistor, as in FIGS. 3, 4A, 4B.

Figure 11:
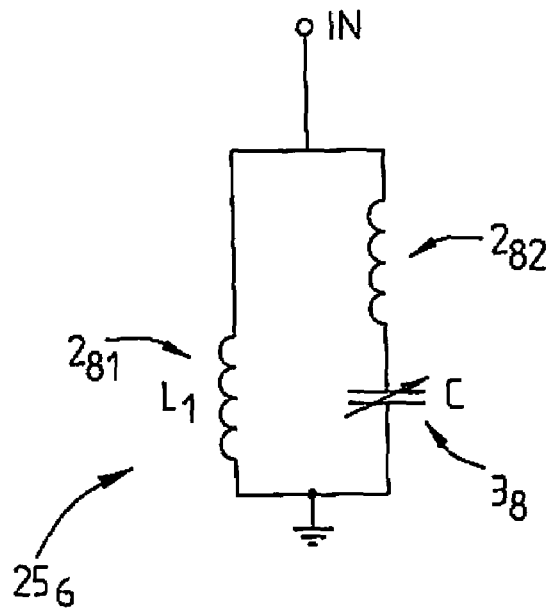
FIG. 11 shows a another example of a filter arrangement.

FIG. 11 shows an alternative filter arrangement $25_6$ for the source node. It comprises an inductor $L_1$ $2_{81}$ connected in parallel with an inductor $L_2$ $2_{82}$ which is connected in series with a capacitor C $3_8$ which is tunable.

$$2\omega_0 = \sqrt{\frac{1}{C(L_1 + L_2)}}$$

where $\omega_0$ is the VCO frequency of operation. At this frequency the filter is parallel resonant and thus provides a high impedance.

$L_1$ must also be chosen sufficiently large so that the filter series resonance at:

$$\omega_s = \sqrt{\frac{1}{CL_2}}.$$

is not too close to the parallel resonance.

The capacitor C $3_8$, or part of it, should be tunable.

Figure 12:
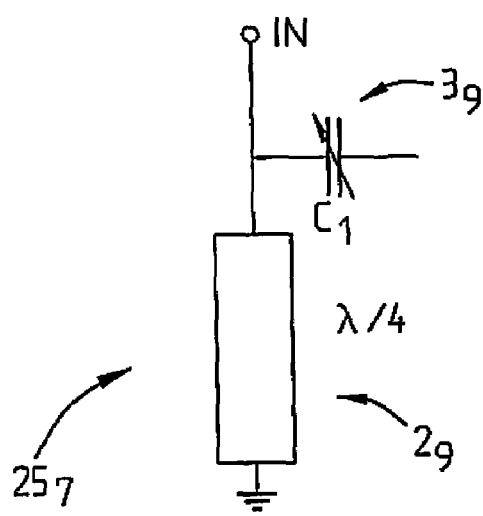
FIG. 12 shows still another example of a filter arrangement.

Another example of a useable filter arrangement $25_7$ comprises a λ/4 transmission line filter e.g. as shown in FIG. 12. A λ/4 transmission line $2_9$ terminated in a short to ground, will present an infinite impedance at the wavelength λ. To make the filter tunable a shunt varactor $C_1$ could be added to the filter. The varactor $3_9$ can be placed at other positions along the transmission line or several varactors can be distributed along the line. The length of the transmission line should be chosen such that it in combination with the varactor presents a high impedance at twice the operating frequency of the VCO for a differential structure. It may thus not be exactly λ/4 long. A DC tuning voltage is applied to varactor $C_1$ $3_9$ (which for AC is substantially grounded).

It is an advantage of the present invention that phase noise can be minimized in an easy, cheap and efficient manner. It is a particular advantage that the phase noise can be minimized automatically over a wide tuning range. It is also an advantage of the invention that the provisioning of the filter arrangement requires no additional headroom and that substantially no noise is added. Further it is an advantage that the optimum operation for lowest phase noise can be found with respect to source/emitter node impedance.

It should be clear that the invention can be varied in a number of ways within the scope of the appended claims without departing from the inventive concept. It is applicable to various different VCO topologies. The arrangement is particularly advantageous for differential pair based VCO and it should also be clear that means for amplitude detection and the circuits for optimizing the amplitude can take many different forms in the case a control circuit is implemented. In general control circuits can be provided for in many different manners. Further, the filter arrangement comprising a tunable varactor in parallel with an inductor can also be replaced by other, generally more complex, tunable filter arrangements having a high impedance at its/the second resonance frequency as defined herein. Also the number of switch transistors may be different from what is explicitly shown.

What is claimed is:

1. An oscillating circuit arrangement comprising:
  a resonating arrangement with a first resonance frequency $\omega_0$ further comprising a voltage controlled oscillator arrangement having at least one switch transistor being a tunable filter arrangement connected to the voltage controlled oscillator arrangement, wherein the filter arrangement is adapted to resonate at a second resonance frequency $\omega_f$, the second resonance frequency being a multiple n, n=1 or 2 of said first resonance frequency $\omega_0$, and being equal to the number of functional switch transistors of the VCO arrangement that is/are required for the VCO arrangement to oscillate at said first resonance frequency, said filter arrangement being adapted to be tunable such that a phase noise of the oscillating circuit arrangement can be minimized through tuning of the filter arrangement; and
  a control circuit adapted to establish the optimizing tuning voltage or current to be applied to the filter arrangement, wherein the control circuit is adapted to maximize an amplitude of the second resonance frequency $\omega_f$, the control circuit comprising an amplitude detector for sensing the amplitude of the signal resonating at the second resonance frequency $\omega_f$ and second amplitude variation detection and control circuit for detecting whether the amplitude varies.

2. An oscillating circuit arrangement according to claim 1, wherein said amplitude variation detection and control circuit comprises a differentiator for taking a derivative of the second resonance frequency signal amplitude.

3. An oscillating circuit arrangement according to claim 1 wherein said second amplitude variation detection control circuit comprises a switch control circuit for controlling a switch said switch being capable of activating a voltage or current regulating circuit comprising a voltage or current increasing circuit comprising a voltage pump up circuit for ramping a voltage up to a preset maximum voltage ($V_{max}$) and/or a voltage or current decreasing circuit comprising a voltage pump down circuit for ramping the voltage down to a preset minimum voltage.

4. An oscillating circuit arrangement according to claim 3, wherein the switch control circuit is adapted to select which of the voltage or current increasing circuit and the voltage or current decreasing circuit that is to be connected to the source or emitter node respectively if it is detected that the amplitude (A) is decreasing.

5. An oscillating circuit arrangement according to claim 1, wherein the control circuit comprises tuning voltage control circuit for controlling the tuning voltage adapted to tune a source node varactor, and that the second amplitude variation detection and control circuit comprises a differentiator for taking a derivative of the amplitude (A) of the signal resonating at the second resonance frequency to the amplitude detector.

6. An oscillating circuit arrangement according to claim 5, wherein the switch control circuit comprise a switch activator which is adapted to activate switching if an input signal is negative, and in that in activated state, the switch is adapted to activate the voltage increasing circuit or the voltage decreasing circuit.

7. A method for minimizing a phase noise of an oscillating circuit arrangement including a resonating arrangement resonating at a first resonance frequency $\omega_0$ and a voltage controlled oscillator arrangement, comprising the steps of:
- connecting a tunable filter arrangement to the voltage controlled oscillator (VCO) arrangement;
- tuning the filter arrangement through applying a voltage or a current wherein the filter arrangement resonates at a second resonance frequency being substantially an integer multiple n, n=1 or 2, of said first resonance frequency and corresponding to a minimum number of functional switch transistors of the oscillating circuit arrangement which are required for oscillation at said first resonance frequency $\omega_0$;
- wherein the step of connecting the filter arrangement further comprises the step of connecting a tunable capacitor in Parallel with an inductor such that it resonates at said second resonance frequency $\omega_f$;
- wherein tuning the filter arrangement further comprises the step of tuning the filter arrangement particularly a tunable voltage, such that the voltage amplitude (A) at a source or emitter node of the voltage controlled oscillator arrangement comprising a differential pair structure comprising a cross-coupled differential pair VCO or a single ended structure with one or more switch transistors acting as a single functional switch transistor, is maximized; and
- using, in a control procedure, a control circuit for automatically finding the optimum varactor tuning voltage or current, the control procedure further comprising the steps of:
- establishing the amplitude of the second resonance frequency $\omega_f$, of the signal in a source or emitter node;
- establishing if the amplitude is increasing or decreasing;
- controlling the tuning voltage or current applied to the tunable capacitor such that the amplitude is increased, and
- wherein the step of establishing if the amplitude is increasing or decreasing further comprises:
- taking a derivative, using a differentiator, of the amplitude of the signal in a source or emitter node or in a common source or emitter node if it comprises a differential structure; and
- increasing or decreasing the tuning voltage or current if the derivative is negative such that the detected amplitude (A) will be maximized.

* * * * *

UNITED STATES PATENT AND TRADEMARK OFFICE
CERTIFICATE OF CORRECTION

PATENT NO. : 7,688,153 B2
APPLICATION NO. : 12/088972
DATED : March 30, 2010
INVENTOR(S) : Jacobsson et al.

It is certified that error appears in the above-identified patent and that said Letters Patent is hereby corrected as shown below:

On the Face Page, in Field (57), under "ABSTRACT", in Column 2, Line 3, delete "(coo)" and insert -- ($\omega_0$) --, therefor.

In Column 4, Line 6, after "i.e." delete "of".

In Column 7, Line 30, delete "141" and insert -- $1_{41}$ --, therefor.

In Column 7, Line 52, delete "$7_{73},1_{74}$" and insert -- $1_{73},1_{74}$ --, therefor.

In Column 9, Lines 61-63, after " $\omega_s = \sqrt{\dfrac{1}{CL_2}}$ " delete ".".

In Column 12, Line 8, in Claim 7, delete "Parallel" and insert -- parallel --, therefor.

Signed and Sealed this

Third Day of August, 2010

David J. Kappos
*Director of the United States Patent and Trademark Office*